(12) United States Patent
Huang et al.

(10) Patent No.: US 9,733,676 B2
(45) Date of Patent: Aug. 15, 2017

(54) TOUCH PANEL AND MANUFACTURING METHOD THEREOF

(71) Applicant: TPK Touch Solutions Inc., Taipei (TW)

(72) Inventors: Jun-Yao Huang, Miaoli (TW); Po-Pin Hung, Kinmen (TW); Hsiang-Yu Teng, Keelung (TW); Chun-Chi Lin, Yunlin (TW)

(73) Assignee: TPK Touch Solutions Inc., Taipei (TW)

( * ) Notice: Subject to any disclaimer, the term of this patent is extended or adjusted under 35 U.S.C. 154(b) by 413 days.

(21) Appl. No.: 14/181,713

(22) Filed: Feb. 16, 2014

(65) Prior Publication Data
US 2014/0240616 A1   Aug. 28, 2014

(30) Foreign Application Priority Data
Feb. 22, 2013   (CN) .......................... 2013 1 0057683

(51) Int. Cl.
G06F 1/16   (2006.01)
G06F 3/044   (2006.01)
H05K 3/10   (2006.01)

(52) U.S. Cl.
CPC ............ *G06F 1/1692* (2013.01); *G06F 3/044* (2013.01); *H05K 3/107* (2013.01); *G06F 2203/04103* (2013.01); *G06F 2203/04111* (2013.01); *Y10T 29/49165* (2015.01)

(58) Field of Classification Search
CPC ........ G06F 1/1692; G06F 3/044; G06F 3/041; G06F 2203/04111
See application file for complete search history.

(56) References Cited

U.S. PATENT DOCUMENTS

| | | | | |
|---|---|---|---|---|
| 2009/0027864 A1* | 1/2009 | Cho | ..................... | H05K 3/3452 361/767 |
| 2010/0134436 A1* | 6/2010 | Jeong | ..................... | G06F 3/044 345/174 |
| 2010/0321327 A1* | 12/2010 | Liu | ..................... | G02F 1/13338 345/174 |
| 2011/0141042 A1* | 6/2011 | Kim | ..................... | G02F 1/13338 345/173 |
| 2012/0073124 A1* | 3/2012 | Chien | ..................... | G06F 3/044 29/622 |

(Continued)

*Primary Examiner* — Claire X Pappas
*Assistant Examiner* — Robert Stone
(74) *Attorney, Agent, or Firm* — Cooper Legal Group LLC

(57) ABSTRACT

A touch panel having a cover plate, a sensor electrode layer, an insulating layer and a jumper layer is provided. The sensor electrode layer has first axis electrodes, second axis electrodes, bonding pads and first periphery traces. Each first axis electrode has first electrode blocks that are electrically connected to each other. Each second axis electrode has second electrode blocks that are electrically isolated from each other. The bonding pads are disposed on the periphery region of the cover plate. The first periphery traces are electrically connected to the bonding pads and the first axis electrodes or the second axis electrodes respectively. The insulating layer has first via holes and second via holes. The jumper layer has jumper traces and second periphery traces, wherein the second periphery traces are electrically connected to the first axis electrodes or the second axis electrodes through the first via holes.

28 Claims, 5 Drawing Sheets

(56) References Cited

U.S. PATENT DOCUMENTS

| | | | |
|---|---|---|---|
| 2012/0098762 A1* | 4/2012 | Kim | G06F 3/044 345/173 |
| 2012/0227259 A1* | 9/2012 | Badaye | G06F 3/044 29/846 |
| 2013/0043068 A1* | 2/2013 | Xie | G06F 3/044 174/262 |
| 2013/0093718 A1* | 4/2013 | Wang | G06F 3/044 345/174 |
| 2014/0125882 A1* | 5/2014 | Jiang | G06F 3/041 349/12 |
| 2014/0240620 A1* | 8/2014 | Chiu | G06F 1/1626 349/12 |
| 2014/0320765 A1* | 10/2014 | Jiang | G06F 3/041 349/12 |

\* cited by examiner

TOUCH PANEL AND MANUFACTURING METHOD THEREOF

BACKGROUND OF THE INVENTION

The present invention claims the priority of China Patent Application No. 201310057683.X filed on Feb. 22, 2013, which is incorporated by reference in the present application in its entirety.

Field of the Invention

The present invention generally is related to a touch panel, more specifically, related to a thin touch panel with a narrow periphery region and the manufacturing method thereof.

Description of Related Art

Modern computing devices generally use specific kinds of pointing devices allowing users to interact with operating systems or graphic interfaces. One of those devices is capacitive touch panel, which is commonly used in laptops, notebooks or other portable computing devices.

Generally, in touch panel manufacturing processes, a sensing assembly formed of a sensing electrode layer and a sensing substrate is directly laminated on an opaque substrate. In this way, the produced touch panel comprises two substrates and therefore became thicker, thereby enlarging the thickness of the whole touch panel and unable to meet the requirement of the thinning tendency.

Accordingly, how to improve the touch panel structure and the manufacturing method in order to decrease the thickness of a touch panel is an important topic in this field.

BRIEF SUMMARY OF THE INVENTION

In order to decrease the thickness and the area of the periphery region of a touch panel, the present invention provides a novel touch panel structure and a manufacturing thereof. The feature of the present invention is that directly forming the sensing electrode on the cover plate to achieve a thinner touch panel. Besides, the same axis electrodes are connected via the periphery traces disposed on different levels, so as to narrow down the periphery region.

The present invention provides a touch panel including a cover plate, a sensor electrode layer, an insulating layer and a jumper layer. The sensor electrode layer is disposed on the cover plate, comprises a plurality of first axis electrodes, a plurality of second axis electrodes, a plurality of bonding pads and a plurality of first periphery traces. Each first axis electrode comprises a plurality of first electrode blocks arranged along a first direction, and the first electrode blocks are electrically connected to each other. Each second axis electrode comprises a plurality of second electrode blocks arranged along a second direction, and the second electrode blocks are electrically isolated from each other. The bonding pads are disposed on the periphery region of the cover plate. The first periphery traces are electrically connected to the bonding pads and the first axis electrodes or the second axis electrodes respectively. An insulating layer is disposed on the sensor electrode layer, wherein a plurality of first via holes and a plurality of second via holes are formed on the insulating layer. Each first via hole exposes the first axis electrodes or the second axis electrodes that are not electrically connected to the first periphery traces, and each second via hole exposes parts of the second electrode blocks of the second axis electrodes. A jumper layer is disposed on the insulating layer. The jumper layer comprises a plurality of jumper traces and a plurality of second periphery traces, wherein the second periphery traces are electrically connected to the first axis electrodes or the second axis electrodes through the first via holes, and the jumper traces are electrically connected to the second electrode blocks of the second axis electrodes through the second via holes, wherein the first axis electrodes or the second axis electrodes are not electrically connected to the first periphery traces.

The present invention further provides a manufacturing method of a touch panel comprising the following steps: a sensor electrode layer is formed on a cover plate, wherein the sensor electrode layer includes a plurality of first axis electrodes and a plurality of second axis electrodes. Each first axis electrode comprises a plurality of first electrode blocks arranged along a first direction, and all the first electrode blocks are electrically connected to one another. Each second axis electrode comprises a plurality of second electrode blocks arranged along a second direction, wherein the second electrode blocks are electrically isolated from one another. A plurality of bonding pads is disposed on the periphery of the cover plate and a plurality of first periphery traces is electrically connected to the bonding pads and the first axis electrodes or the second axis electrodes respectively. An insulating layer is formed on the sensor electrode layer, wherein a plurality of first via holes and a plurality of second via holes are formed in the insulating layer. Each first via hole exposes the first axis electrodes or the second axis electrodes that are not electrically connected to the first periphery traces, and each second via hole exposes parts of the second electrode blocks of the second axis electrodes. Then a jumper layer is formed on the insulating layer, wherein the jumper layer comprises a plurality of jumper traces and a plurality of second periphery traces. The second periphery traces are electrically connected to the first axis electrodes or the second axis electrodes through the first via holes, and the jumper traces are electrically connected to the second electrode blocks of the second axis electrodes through the second via holes, wherein the first axis electrodes or the second axis electrodes are not electrically connected to the first periphery traces.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

These and other objectives of the present invention will no doubt become obvious to those of ordinary skill in the art after reading the following detailed description of the preferred embodiment that is illustrated in the various figures and drawings.

DETAILED DESCRIPTION OF THE PREFERRED EMBODIMENTS

Figure 1:
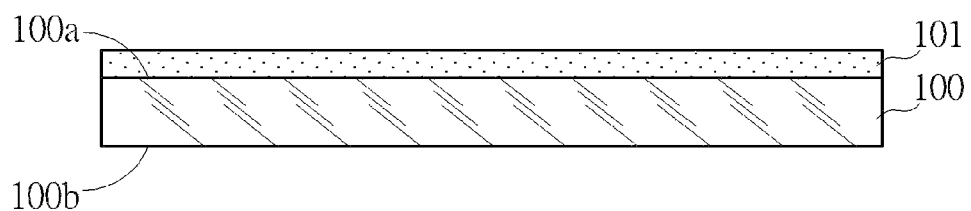
FIGS. 1~7 are schematic cross-sectional views showing the manufacturing process of the touch panel according to one embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 8:
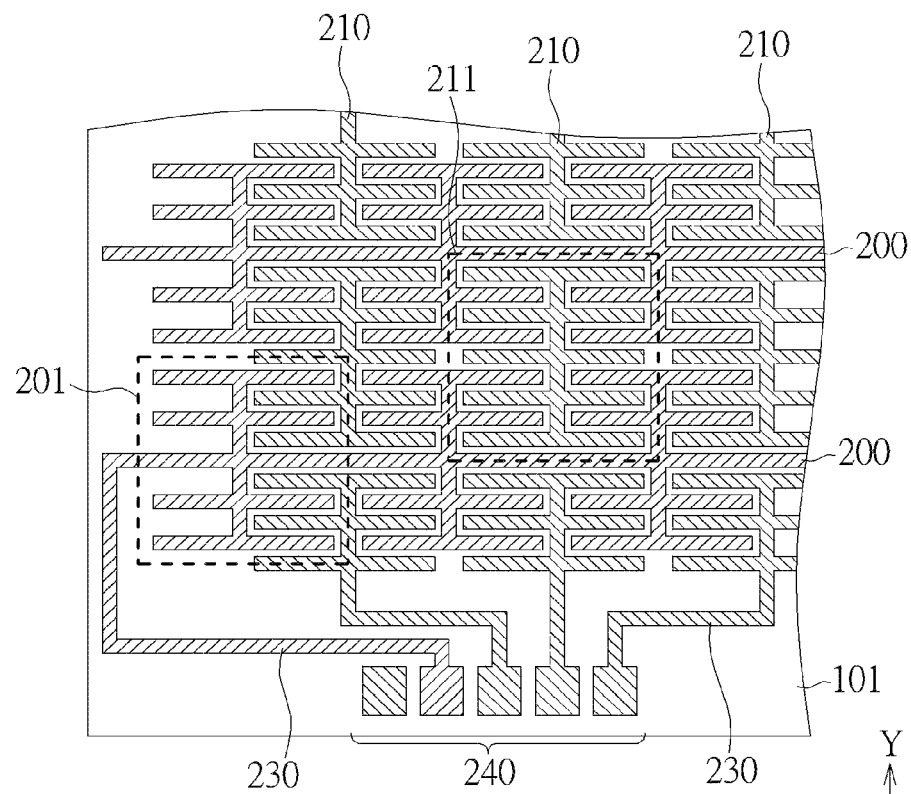
FIG. 8 is a top view showing the sensing electrode layer of the touch panel according to one embodiment of the present invention.
Figure 9:
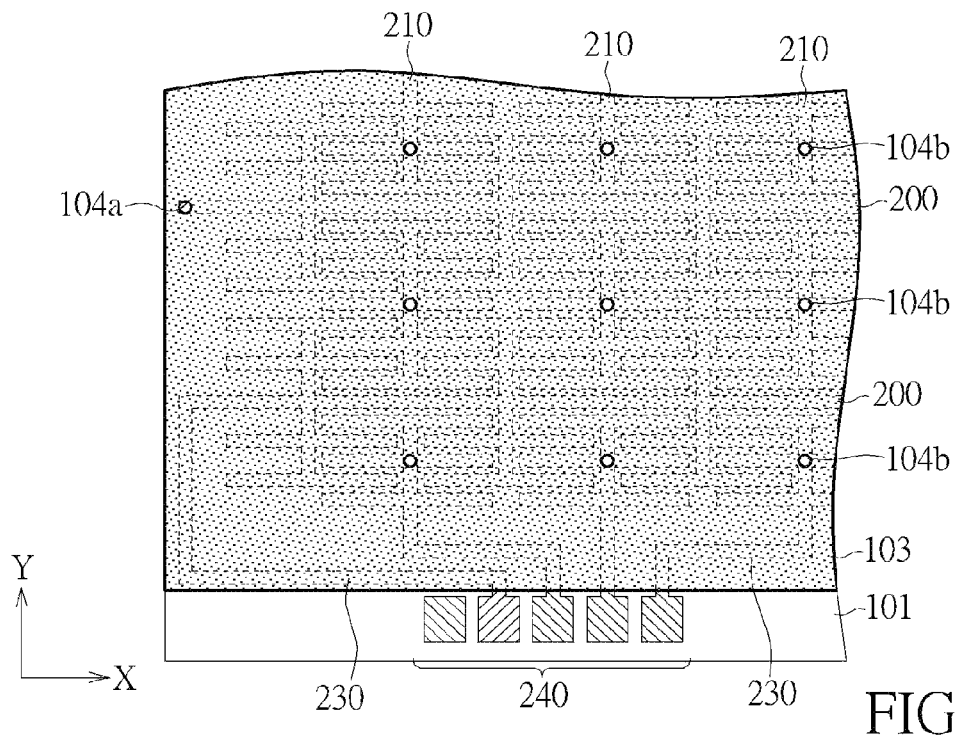
FIG. 9 is a top view showing the insulating layer of the touch panel according to one embodiment of the present invention.
Figure 10:
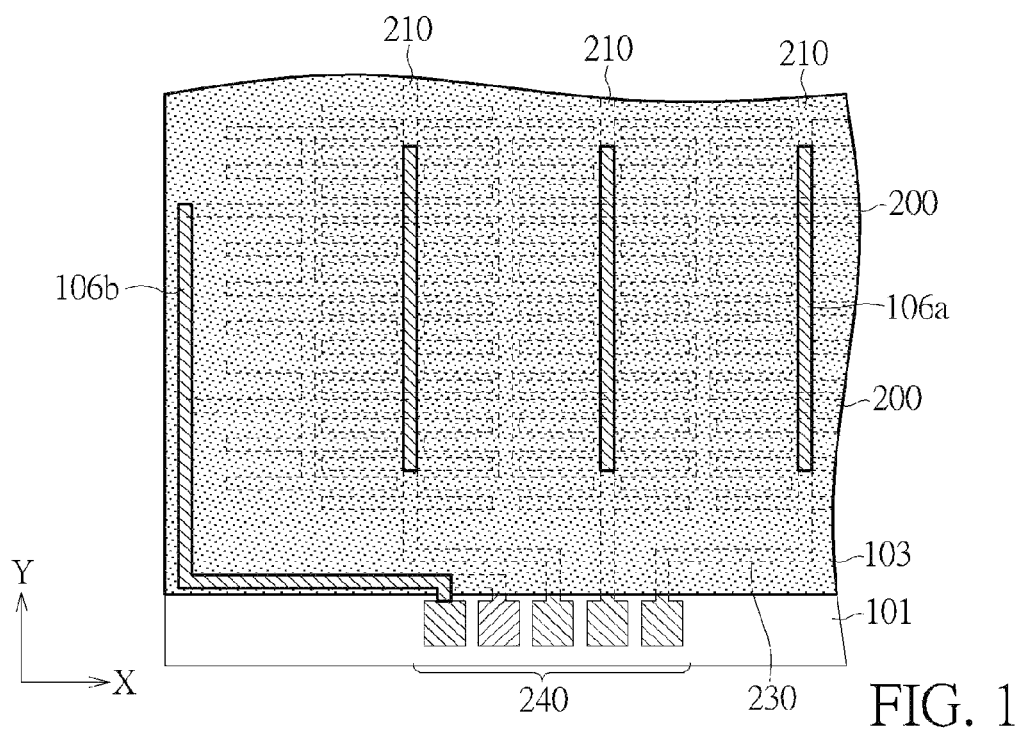
FIG. 10 is a top view showing the jumper layer of the touch panel according to one embodiment of the present invention.

The following description will provides a plurality of embodiments accompanied with figures to illustrate the present invention. FIGS. 1~7 are schematic cross-sectional views showing the manufacturing process of the touch panel according to one embodiment of the present invention, FIGS. 8~10 are top views showing the lower sensing layer, the middle insulating layer and the upper jumper layer of the touch panel in sequence according to one embodiment of the present invention.

Please refer to FIG. 1. First, a cover plate 100 is provided, such as a glass plate or a plastic plate, which is used as the substrate for the components, wherein the cover plate 100 may be a strengthened plate. The cover plate has a first surface 100a and a second surface 100b in opposition to each other. In order to let the touch panel present opaquely, it may directly use an opaque cover plate or, for example, it may print a non-conductive color layer 101 on the first surface 100a so as to render the touch panel present the color of the color layer 101. The color layer 101 can be chosen to be a silver color layer. In one embodiment, the color layer 101 can be selected from a high temperature resistant material, for example, that can withstand a temperature about 160° C. to 250° C. It is not difficult to understand that the material of the high temperature resistant color layer 101 may be selected according to the forming temperature of the other components formed thereon. In one embodiment, the thickness of the color layer 101 is about 0.001 mm to 0.005 mm (millimeter), such as 0.004 mm. In addition, since the color layer 101 is formed on the first surface 100a, other components are sequentially formed on the color layer 101. Alternatively, if the cover plate is an opaque cover plate, other components are sequentially formed on the first surface 100a of the cover plate 100 directly.

The second surface 100b is the surface where the contact with the finger or the indicators pen occurs. A physical or a chemical process can be performed on the second surface 100b so as to render the second surface 100b a textured surface, and to change the touch feeling and the visual display. More specifically, the textured surface having a certain roughness of the surface is caused by said physical processes such as a grinding or a polishing process, or is caused by said chemical processes such as an etching process. In addition, anti-glare layer, a stain-resistant layer, an anti-reflective layer or a combination thereof may be selectively formed on the textured second surface 100b. Please note that, in this invention, an infrared baking process or an ultraviolet baking process can be selectively performed after each layer is printed, in order to form the printed conductive materials or the printed non-conductive materials, and this feature will not be mentioned below for brevity.

Figure 2:
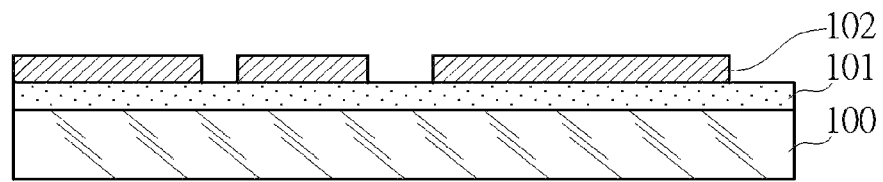

After the color layer 101 is formed, as shown in FIG. 2, a conductive layer, such as a conductive silver paste layer or a conductive carbon paste layer, is formed on the color layer 101 through a printing process, so as to form a sensing electrode layer 102, wherein the sensing electrode layer 102 has electrode patterns and trace patterns. In one embodiment, thickness of the sensing electrode layer 102 is about 0.01 mm to 0.03 mm. FIG. 8 shows the pattern of the sensing electrode layer of one embodiment of the present invention. In this embodiment, the sensing electrode layer 102 comprises a plurality of first axis electrodes 200, a plurality of second axis electrodes 210, a plurality of first periphery traces 230 and a plurality of bonding pads 240. Each first axis electrode 200 is composed of a plurality of comb-shaped first electrode blocks 201, wherein the first electrode blocks 201 are arranged along a first direction (such as the X-direction) and are electrically connected to each other. Each first axis electrode 200 is arranged along a second direction (such as the Y-direction). Each second axis electrode 210 is composed of a plurality of comb-shaped second electrode blocks 211, wherein the second electrode blocks 211 are arranged along the second direction and are electrically isolated from each other. Each second axis electrode 210 is arranged along the first direction. An intersection angle between the first direction and the second direction is preferably of 90 degrees. The first electrode blocks 201 and the second electrode blocks 211 do not contact each other and are arranged in an interleaved comb shape, so that a capacitor area can be formed within the space between the first electrode blocks 201 and the second electrode blocks 211. The first axis electrodes 200 and the second axis electrodes 210 are electrically connected to the corresponding bonding pads 240 in the peripheral region respectively, and the signals are delivered between processing devices and the bonding pads 240 through the outside circuit (i.e., a flexible circuit board). It is worth noted that, the electrode pattern of the present invention is not limited to the pattern shown in FIG. 8, the shapes, the number, the angle and the arrangement of the electrode pattern can be modified according to actual requirements.

It is worth noted that, in order to meet the trace requirement and narrow down the periphery region, as shown in FIG. 8, only parts of the first electrodes 200 of the sensing electrode layer 102 are electrically connected to the corresponding bonding pads 240 through the first periphery traces 230, and all of the second electrodes 210 are electrically connected to the corresponding bonding pads 240 through the first periphery traces 230. However, in other embodiments, the structure may be designed to have a number of the first electrodes 200 and a number of the second electrodes 210 electrically connected to the corresponding bonding pads 240 through the first periphery traces 230, or to have a number of the second electrodes 210 of the sensing electrode layer 102 electrically connected to the corresponding bonding pads 240 through the first periphery traces 230 and all of the first electrodes 200 are electrically connected to the corresponding bonding pads 240 through the first periphery traces 230.

Figure 3:
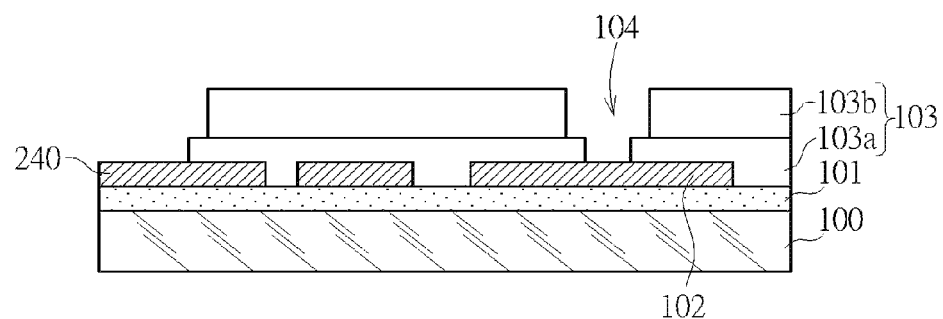

After the sensing electrode layer 102 is formed, as shown in FIG. 3, a non-conductive film is formed on the sensing electrode layer 102 and the color layer 101, such as a photoresist layer or an insulating ink layer, to form an insulating layer 103. Besides, this step can be performed repeatedly to form more than one insulating layer, such as the insulating layers 103a and 103b shown in FIG. 3, to reach required thickness of the insulating layer. In this embodiment, the thickness of the insulating layers 103a and 103b may be between 0.01 mm to 0.03 mm, such as 0.02 mm. The insulating layer 103 comprises a plurality of via holes 104 to expose the corresponding sensing electrode layer 102 disposed below. Alternatively, the insulating layer 103 may not completely cover the whole sensing electrode 102 and the whole color layer 101, the bonding pads 240 within the periphery region may be exposed to allow the bonding pads 240 to be electrically connected to the traces in the following steps. This step will be hereinafter described in detail in reference to the FIG. 9.

FIG. 9 is a top view showing the insulating layer 103 according to one embodiment of the present invention. As shown in FIG. 9, the insulating layer 103 (shown as a shaded area in the figure) does not cover the lower region of the bonding pads 240, so that the traces which are formed on the insulating layer 103 in following steps can be electrically connected to the bonding pads 240 directly. In addition, the insulating layer 103 may have two types of via holes: a plurality of first via holes 104a and a plurality of second via holes 104b. The first via hole 104a exposes the first axis electrodes 200 or the second axis electrodes 210 that are not electrically connected to the bonding pads 240 through the first periphery traces 230 (in this embodiment, the first axis electrodes 200 are taken as an example). Preferably, the first via hole 104a exposes and corresponds to at least one end region of the first axis electrode 200 and/or the second axis electrode 210, while the second via hole 104b respectively exposes and corresponds to two second electrode blocks 211 that is insulated from each other in the an axis electrode 210.

Figure 4:
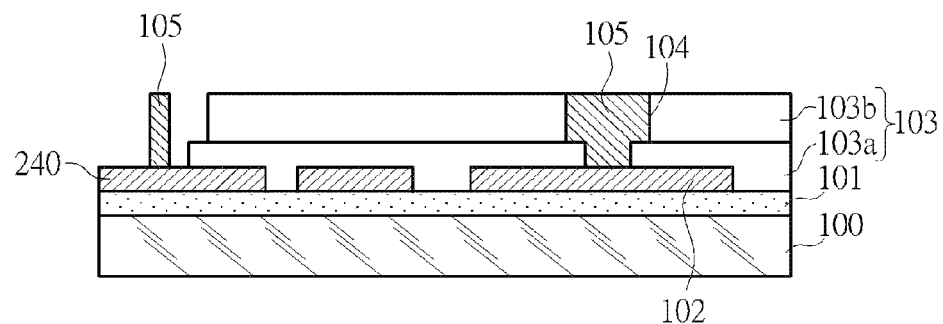

After the insulating layer 103 is formed, as shown in FIG. 4, a conductive layer 105, such as a conductive silver paste layer or a conductive carbon paste layer, is formed in the via holes 104 and on the exposed bonding pads 240 through a printing process. More specifically, if the via holes 104 includes first via holes 104a and second via holes 104b as shown in FIG. 9, the conductive layer 105 is printed in the first via holes 104a and in the second via holes 104b.

Figure 5:
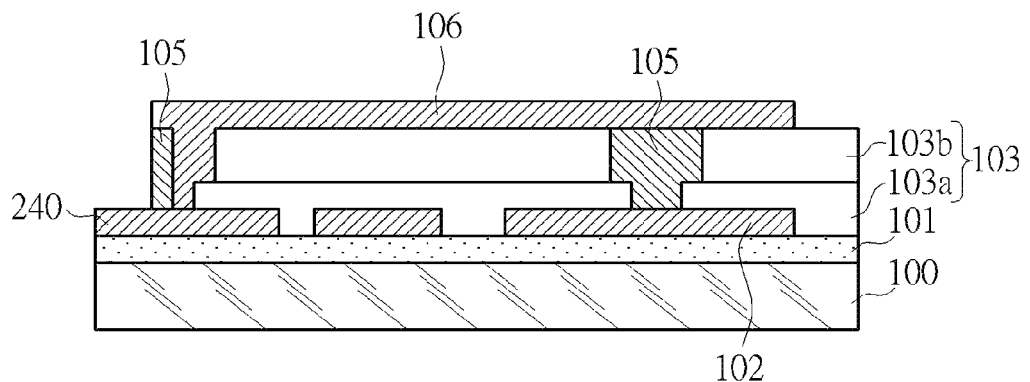

After the conductive layer 105 is formed, as shown in FIG. 5 and FIG. 10, another conductive layer, such as a conductive silver paste layer or a conductive carbon paste layer, is formed on the conductive layer 105 and on the insulating layer 103, so as to form a jumper layer 106. The material of the jumper layer 106 can be similar to the material of the conductive layer 105, and the jumper layer 106 can be electrically connected to the conductive layer 105. Therefore, a number of the first axis electrodes 200 or a number of the second axis electrodes 210 in the sensing layer 102 that are not electrically connected to bonding pads 240 through the first periphery traces 230 can be electrically connected to the bonding pads 240 through the jumper layer 106 or through the conductive layer 105, so that the second electrode blocks 211 can be electrically connected to each other through the jumper layer 106 or through the conductive layer 105 and construct a completed second axis electrodes. It is worth noted that in other embodiments, the conductive layer 105 and the jumper layer 106 can be formed simultaneously in one step. That is, the conductive layer 105 is a part of the jumper layer 106, and the jumper layer 106 described below comprises the conductive layer 105.

FIG. 10 is a top view showing the jumper layer of the touch panel according to one embodiment of the present invention. As shown in FIG. 10, the jumper layer 106 comprises a plurality of jumper traces 106a and a plurality of second periphery traces 106b. The jumper traces 106a cover the second via holes 104b of the insulating layer 103. More specifically, each jumper trace 106a covers the second via holes 104b that expose the corresponding second electrode blocks 211, so that the second electrode blocks 211 can be electrically connected to each other through the jumper traces 106a, thereby forming the completed second axis electrodes 210. As mentioned above, when the conductive layer 105 and the jumper layer 106 are formed simultaneously in single printing step, the jumper trace 106a will include the conductive layer 105 in the first via holes 104a and in the second via holes 104b, and the main body of the jumper trace 106a disposed on the insulating layer 103. On the other hand, the second periphery traces 106b cover the first via holes 104a at the end region of the first axis electrodes 200 and/or the second axis electrodes 210 that are not electrically connected to the bonding pads 240 through the first periphery traces 230. Therefore, the first axis electrodes 200 or the second axis electrodes 210 that are not electrically connected to the bonding pads 240 through the first periphery traces 230 can be electrically connected to the bonding pads 240 through the second periphery traces 106b. Please notes that in this embodiment, the second periphery traces 106b may optionally overlap the first periphery traces 106a, but not limited thereto.

According to the above-mentioned description, in the present invention, the design of jumper traces 106a and the second periphery traces 106b disposed on different levels not only enables the connection of the first axis electrodes 200 and the second axis electrodes 210 to the corresponding bonding pads 240, but also narrows down the periphery region to fulfill the requirement of slim bezel.

Figure 6:
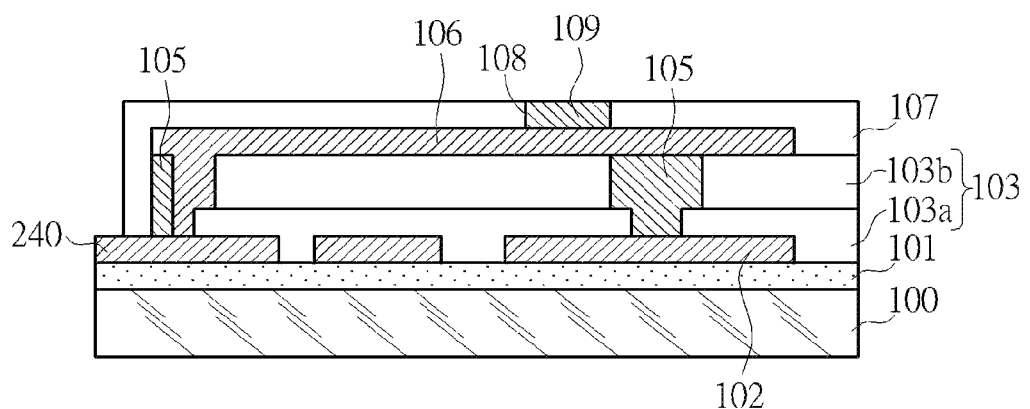

After the jumper layer 106 is formed, as shown in FIG. 6, a non-conductive layer, such as a photoresist layer or an insulating ink layer, is printed on the jumper layer 106 and on the insulating layer 103 to form a top insulating layer 107. The top insulating layer 107 covers the whole jumper layer 106 and protects circuit pattern therein. In this embodiment, the top insulating layer 107 has a plurality of via holes 108 (refer hereinafter as third via holes) that expose a part of the jumper layer 106, so that the jumper layer 106 may be electrically connected to an external circuit. Similarly, a conductive layer 109 can be formed in each via hole 108 by a printing process.

Figure 7:
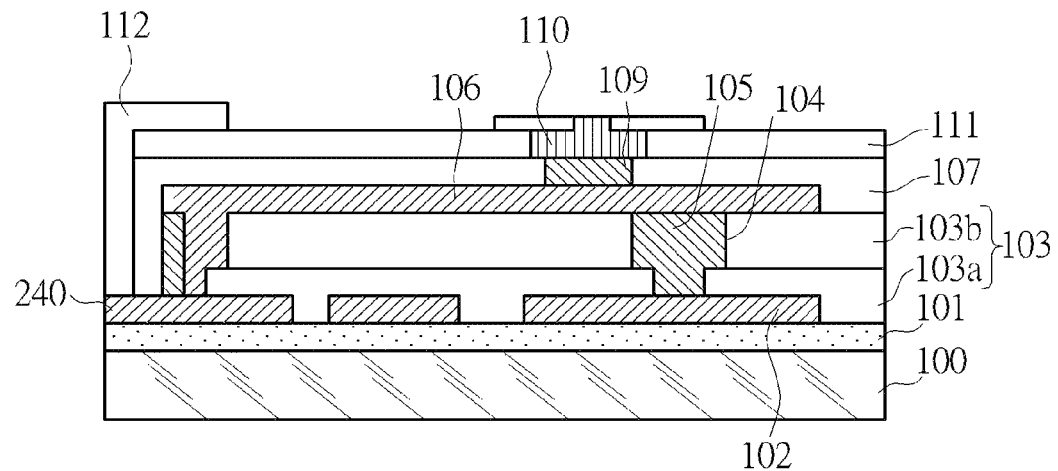

After the conductive layer 109 is formed, please refer to FIG. 7, an external circuit, such as a metal-dome switch 110 as an example, can be formed on the top insulating layer 107. As shown in FIG. 7, the metal-dome switch 110 is electrically connected to the underlying jumper layer 106 through the conductive layer 109 so the user can input signals by pressing the metal-dome switch 110. In addition, a shield layer 111 can be further formed on the top insulating layer 107 to prevent electromagnetic interferences. The thickness of the top insulating layer 107 may be between 0.01 mm to 0.03 mm, f0.02 mm for instance. Finally, a flexible circuit board 112 is bonded on the corresponding bonding pads 240 of the touch panel. Therefore, the signal generated by the sensing layer 102 can be delivered and communicated with the outside computing devices through the flexible circuit board 112.

According to the manufacturing process mention above, the present invention also provides a novel touch panel structure. As shown in FIG. 7~10, the touch panel comprises a cover plate 100, a sensor electrode layer 102, an insulating layer 103 and a jumper layer 106. The sensor electrode layer 102 disposed on the cover plate 100, wherein the sensor electrode layer 102 comprises a plurality of first axis electrodes 200, a plurality of second axis electrodes 210, a plurality of bonding pads 240 and a plurality of first periphery traces 230. Each first axis electrode 200 comprises a plurality of first electrode blocks 201 arranged along a first direction, wherein the first electrode blocks 201 are electrically connected to each other. Each second axis electrode 210 comprises a plurality of second electrode blocks 211 arranged along a second direction (as shown in FIG. 8), and the second electrode blocks 211 are electrically isolated from each other. The bonding pads 240 disposed on the periphery region of the cover plate 100. The first periphery traces 230 are electrically connected to the bonding pads 240 and the first axis electrodes 200 or the second axis electrodes 210 respectively. The insulating layer 103 disposed on the sensor electrode layer 102, wherein a plurality of first via holes 104a and a plurality of second via holes 104b are formed on the insulating layer 103 (as shown in FIG. 9), wherein each first via hole 104a exposes the first axis electrodes 200 or the second axis electrodes 210 that are not electrically connected to the first periphery traces 230, and each second via hole 104b exposes parts of the second electrode blocks 211 of the second axis electrodes 210. The jumper layer 106 is disposed on the insulating layer 103 comprising a plurality of jumper traces 106a and a plurality of second periphery traces 106b (as shown in FIG. 10), wherein the second periphery traces 106b are electrically connected the first axis electrodes 200 or the second axis electrodes 210 that are not electrically connected to the first periphery traces 230 through the first via holes 104a, and the jumper traces 106a are electrically connected the second electrode blocks 211 of the second axis electrodes 210 through the second via holes 104b.

The touch panel of the present invention further comprises a color layer 101 which is disposed between the cover plate 100 and the sensing electrode layer 102.

The touch panel of the present invention further comprises a top insulating layer 107 which is disposed on the jumper layer 106 and on the insulating layer 103.

The touch panel of the present invention further comprises at least one third via hole (the third via hole) 108 formed in the top insulating layer 107, the via hole 108 exposes the jumper layer 106 and enables the jumper layer 106 to be electrically connected to an external circuit, such as a metal-dome switch 110, through the third via hole 108.

In one embodiment, the insulating layer 103 can be a multiple layer structure, for instance, the insulating layer may comprise insulating layers 103a and 103b.

In the present invention, the electrodes and the traces are formed on the cover plate through a printing process, which may provides a thinner thickness than that of the conventional electrodes or traces, thereby decreasing the overall thickness of the touch panel.

Furthermore, in conventional touch panel manufacturing processes, the traces and the first axis electrode or the second axis electrode are formed on the same level, so a large periphery region is needed to integer the traces, thereby effecting the area of the active region of the touch panel. In this present invention, parts of the traces are formed on different levels, which enable the traces to overlap one another, thereby narrowing down the area of the periphery region.

In addition, since parts of the traces are disposed on different levels, some arrangement limitations can be resolved, and the arrangements possibilities of the traces are broaden.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A touch panel, comprising: a cover plate; a sensor electrode layer, disposed on the cover plate, wherein the sensor electrode layer comprises: a plurality of first axis electrodes, wherein each first axis electrode comprises a plurality of first electrode blocks arranged along a first direction, and the first electrode blocks are electrically connected to each other; a plurality of second axis electrodes, wherein each second axis electrode comprises a plurality of second electrode blocks arranged along a second direction, and the second electrode blocks are electrically isolated from each other; a plurality of bonding pads, disposed on the periphery region of the cover plate; and a plurality of first periphery traces, which are electrically connected to the bonding pads and the first axis electrodes or the second axis electrodes respectively; an insulating layer, disposed on the sensor electrode layer, wherein a plurality of first via holes and a plurality of second via holes are formed on the insulating layer, wherein each first via hole exposes the first axis electrodes or the second axis electrodes that are not electrically connected to the first periphery traces, and each second via hole exposes parts of the second electrode blocks of the second axis electrodes; and a jumper layer, disposed on the insulating layer, wherein the jumper layer comprises a plurality of jumper traces and a plurality of second periphery traces, wherein the second periphery traces are electrically connected to the first axis electrodes or the second axis electrodes through the first via holes, and the jumper traces are electrically connected the second electrode blocks of the second axis electrodes through the second via holes, wherein the first axis electrodes or the second axis electrodes are not electrically connected to the first periphery traces; and the touch panel further comprising a top insulating layer disposed on the jumper layer and a plurality of third via holes disposed on the top insulating layer, exposing the jumper layer; wherein the jumper layer is electrically connected to external traces through the third via holes.

2. The touch panel of claim 1, wherein each jumper trace comprises a conductive material in the first via holes and in the second via holes, and a jumper trace disposed on the insulating layer.

3. The touch panel of claim 1, further comprising a color layer disposed between the cover plate and the sensor electrode layer.

4. The touch panel of claim 1, wherein the cover plate comprises a first surface and a second surface corresponding to the first surface, the sensor electrode layer is disposed on the first surface of the cover plate, and an anti-glare layer, a stain-resistant layer, an anti-reflective layer or the composition thereof are disposed on the second surface of the cover plate.

5. The touch panel of claim 4, wherein the second surface is a textured surface.

6. The touch panel of claim 1, wherein the first electrode blocks and the second electrode blocks are comb shaped and interlaced disposed on the cover plate.

7. The touch panel of claim 1, wherein the first axis electrodes are arranged along a second direction and the second axis electrodes are arranged along a first direction.

8. The touch panel of claim 1, wherein the insulating layer is a multiple layer structure.

9. The touch panel of claim 1, wherein the sensor electrode layer and the jumper layer comprises conductive silver paste or conductive carbon paste.

10. The touch panel of claim 1, wherein the insulating layer comprises photoresist material or insulating ink.

11. The touch panel of claim 1, wherein the cover plate made of glass.

12. A manufacturing method of a touch panel, comprising the following steps: forming a sensor electrode layer on a cover plate, wherein the sensor electrode layer comprises: a plurality of first axis electrodes, with each first axis electrode comprising a plurality of first electrode blocks arranged along a first direction, wherein the first electrode blocks are electrically connected to each other; a plurality of second axis electrodes, with each second axis electrode comprising a plurality of second electrode blocks arranged along a second direction, wherein the second electrode blocks are electrically isolated from each other; a plurality of bonding pads, disposed on the periphery of the cover plate; and a plurality of first periphery traces that are electrically connected to the bonding pads and the first axis electrodes or the second axis electrodes respectively; forming a insulating layer on the sensor electrode layer, wherein a plurality of first via holes and a plurality of second via holes are formed on the insulating layer, wherein each first via hole exposes the first axis electrodes or the second axis electrodes that are not electrically connected to the first periphery traces, and each second via hole exposes parts of the second electrode blocks of the second axis electrodes; forming a jumper layer on the insulating layer, wherein the jumper layer comprises a plurality of jumper traces and a plurality of second periphery traces, wherein the second periphery traces are electrically connected to the first axis electrodes or the second axis electrodes through the first via holes, and the jumper traces are electrically connected to the second electrode blocks of the second axis electrodes through the second via holes, wherein the first axis electrodes or the second axis electrodes are not electrically connected to the first periphery traces; and forming a top insulating layer on the jumper layer; and forming a plurality of third via holes disposed on the top insulating layer and exposing the jumper layer, and forming a conductive material in the third via holes to electrically connect the jumper layer to an external trace.

13. The manufacturing method of a touch panel of claim 12, wherein the formation of the jumper traces further comprises: forming a conductive material in the first via holes and the second via holes of the insulating layer, and on parts of the bonding pads; and forming a jumper trace on the insulating layer, wherein the jumper trace is electrically connected to the conductive material.

14. The manufacturing method of a touch panel of claim 12, wherein the sensor electrode layer, the insulating layer and the jumper layer are formed through a printing process.

15. The manufacturing method of a touch panel of claim 14, wherein the insulating layer is formed through a multiple layer printing process.

16. The manufacturing method of a touch panel of claim 14, further comprising an infrared baking process or an ultraviolet baking process to dry the sensor electrode layer, the insulating layer and the jumper layer once the printing process is performed.

17. The manufacturing method of a touch panel of claim 12, further comprising forming a color layer on the cover plate before the sensor electrode layer is formed.

18. A touch panel, comprising: a cover plate; a sensor electrode layer, disposed on the cover plate, wherein the sensor electrode layer comprises: a plurality of first axis electrodes, wherein each first axis electrode comprises a plurality of first electrode blocks arranged along a first direction, and the first electrode blocks are electrically connected to each other; a plurality of second axis electrodes, wherein: each second axis electrode comprises a plurality of second electrode blocks arranged along a second direction, and the second electrode blocks are electrically isolated from each other; a plurality of bonding pads, disposed on the periphery region of the cover plate; and a plurality of first periphery traces, which are electrically connected to the bonding pads and the first axis electrodes or the second axis electrodes respectively; an insulating layer, disposed on the sensor electrode layer, wherein a plurality of first via holes and a plurality of second via holes are formed on the insulating layer, wherein each first via hole exposes the first axis electrodes or the second axis electrodes that are not electrically connected to the first periphery traces, and each second via hole exposes parts of the second electrode blocks of the second axis electrodes; and a jumper layer, disposed on the insulating layer, wherein the jumper layer comprises a plurality of jumper traces and a plurality of second periphery traces, wherein the second periphery traces are electrically connected to the first axis electrodes or the second axis electrodes through the first via holes, and the jumper traces are electrically connected the second electrode blocks of the second axis electrodes through the second via holes, wherein the first axis electrodes or the second axis electrodes are not electrically connected to the first periphery traces; wherein the cover plate comprises a first surface and a second surface corresponding to the first surface, the sensor electrode layer is disposed on the first surface of the cover plate, and an anti-glare layer, a stain-resistant layer, an anti-reflective layer or the composition thereof are disposed on the second surface of the cover plate; and wherein the second surface is a textured surface.

19. The touch panel of claim 18, wherein each jumper trace comprises a conductive material in the first via holes and in the second via holes, and a jumper trace disposed on the insulating layer.

20. The touch panel of claim 18, further comprising a color layer disposed between the cover plate and the sensor electrode layer.

21. The touch panel of claim 18, further comprising a top insulating layer disposed on the jumper layer.

22. The touch panel of claim 18, further comprising a plurality of third via holes disposed on the top insulating layer, exposing the jumper layer, wherein the jumper layer is electrically connected to external traces through the third via holes.

23. The touch panel of claim 18, wherein the first electrode blocks and the second electrode blocks are comb shaped and interlaced disposed on the cover plate.

24. The touch panel of claim 18, wherein the first axis electrodes are arranged along a second direction and the second axis electrodes are arranged along a first direction.

25. The touch panel of claim 18, wherein the insulating layer is a multiple layer structure.

26. The touch panel of claim 18, wherein the sensor electrode layer and the jumper layer comprises conductive silver paste or conductive carbon paste.

27. The touch panel of claim 18, wherein the insulating layer comprises photoresist material or insulating ink.

28. The touch panel of claim 18, wherein the cover plate is made of glass.

\* \* \* \* \*